United States Patent
Tsai

(10) Patent No.: US 7,144,184 B1
(45) Date of Patent: Dec. 5, 2006

(54) ROTARY-TYPE FASTENING STRUCTURE

(75) Inventor: Shiang-Shiang Tsai, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 0 days.

(21) Appl. No.: 11/192,093

(22) Filed: Jul. 29, 2005

(51) Int. Cl.
*F16B 5/10* (2006.01)
*A47B 57/26* (2006.01)

(52) U.S. Cl. .................. 403/350; 211/192; 403/167

(58) Field of Classification Search .............. 403/353, 403/322.1, 231, 322.3, 322.4, 240, 316–320, 403/350, 253, 167, 168, 241, 314; 211/191, 211/192, 208, 26; 312/319.1, 319.2
See application file for complete search history.

(56) References Cited

U.S. PATENT DOCUMENTS

| | | | |
|---|---|---|---|
| 5,015,117 A * | 5/1991 | Pawlicki | 403/300 |
| 6,079,173 A * | 6/2000 | Waalkes et al. | 52/239 |
| 6,422,399 B1 * | 7/2002 | Castillo et al. | 211/26 |
| 6,935,711 B1 * | 8/2005 | Naue et al. | 312/334.4 |
| 6,974,037 B1 * | 12/2005 | Haney | 211/26 |
| 2004/0047679 A1 * | 3/2004 | Lauchner et al. | 403/329 |
| 2004/0089779 A1 * | 5/2004 | Greenwald et al. | 248/241 |
| 2004/0104184 A1 * | 6/2004 | Hartman et al. | 211/26 |
| 2005/0042026 A1 * | 2/2005 | Greenside et al. | 403/322.4 |

* cited by examiner

*Primary Examiner*—Daniel P. Stodola
*Assistant Examiner*—Joshua T. Kennedy
(74) *Attorney, Agent, or Firm*—Troxell Law Office, PLLC

(57) ABSTRACT

A rotary-type fastening structure for fixedly coupling an extension rod with a coupling plate, having a rotatable fastening device in the form of a main body with an off-center shaft hole. The rotatable fastening device can be rotated off-center so as to lean its lateral edge on the coupling plate and selectively secure the extension bar to the coupling plate.

5 Claims, 7 Drawing Sheets

ROTARY-TYPE FASTENING STRUCTURE

FIELD OF THE INVENTION

The present invention is related to a rotary-type fastening structure for use in a slideway, and more particularly to an off-center rotary-type fastening structure with multi-stage locking devices.

BACKGROUND OF THE INVENTION

In the general server box, the aperture specification of the coupling plate coupled with the drawer slideway is fixed. The slideway is always coupled with the box or the lateral portion of the cabinet by a screwing method. As a result, the drawer or the tray can be coupled with the slideway for the push-pull purpose. However, different coupling plates are provided with different specifications. In order to be suitable for boxes of different specifications, the slideways of different specifications must be provided. Accordingly, the conventional structure is short of convenience and is not suitable for use in the industry.

SUMMARY OF THE INVENTION

In view of the foregoing drawbacks of the conventional structure, the present invention discloses a rotary-type fastening structure for coupling an extension rod of a slideway with a coupling plate without the use of the screw.

It is a main object of the present invention to provide an off-center rotary-type fastening structure with multi-stage locking devices, wherein two rotatable fastening devices are off-center rotated so as to couple an extension rod with a coupling plate. As a result, a slideway of the present invention can be applied to different boxes for performing the push-pull operation. By contrast, in the general server box, the coupling plates of different specifications are applied to the slideway. Accordingly, in the present invention, the extension rod is coupled with the coupling plate by use of the rotary-type fastening structure.

It is another object of the present invention to couple the extension rod with the coupling plate by rotating the rotatable fastening devices, wherein the rotatable fastening devices are located to further lean on the elastic fastening sheet so as to fix the rotatable fastening devices.

Other objects and features of the present invention will become apparent from the following detailed description when taken in conjunction with the drawings in which:

DETAILED DESCRIPTION OF THE PREFERRED EMBODIMENT

The above-mentioned features and advantages of this invention, and the manner of attaining them, will become more apparent and the invention will be better understood by reference to the following description of embodiments of the invention taken in conjunction with the drawings.

Figure 1:
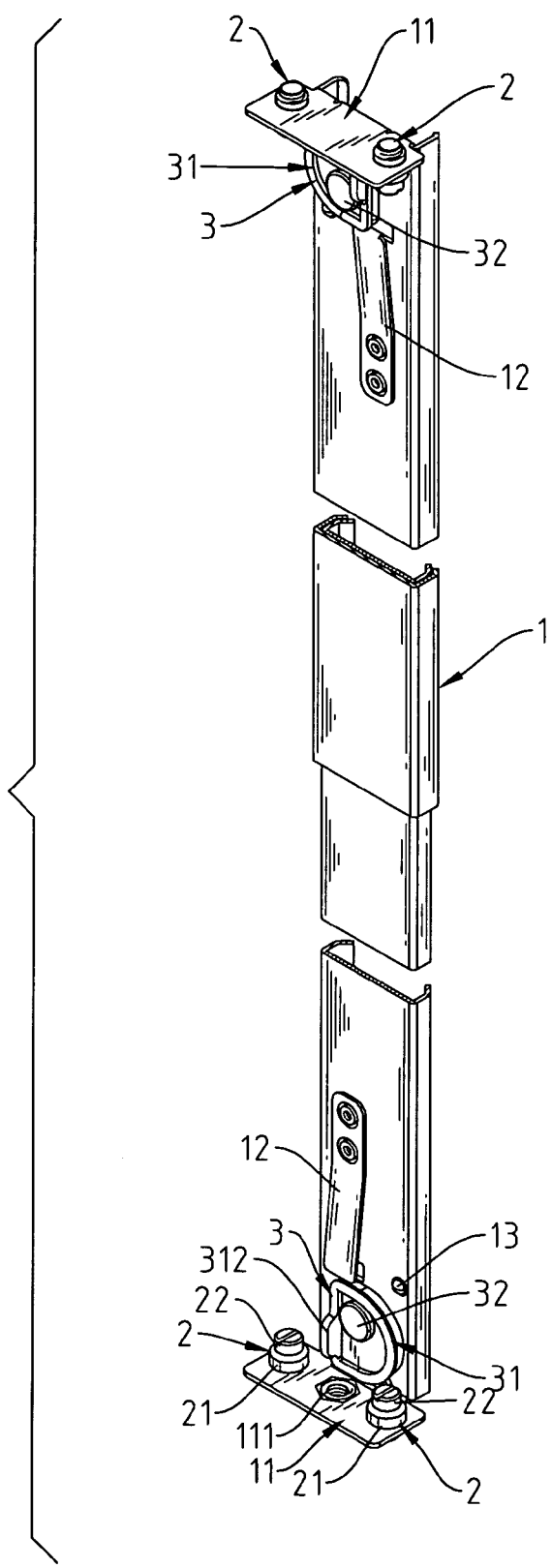
FIG. 1 is an elevational view showing the structure of the present invention.
Figure 2:
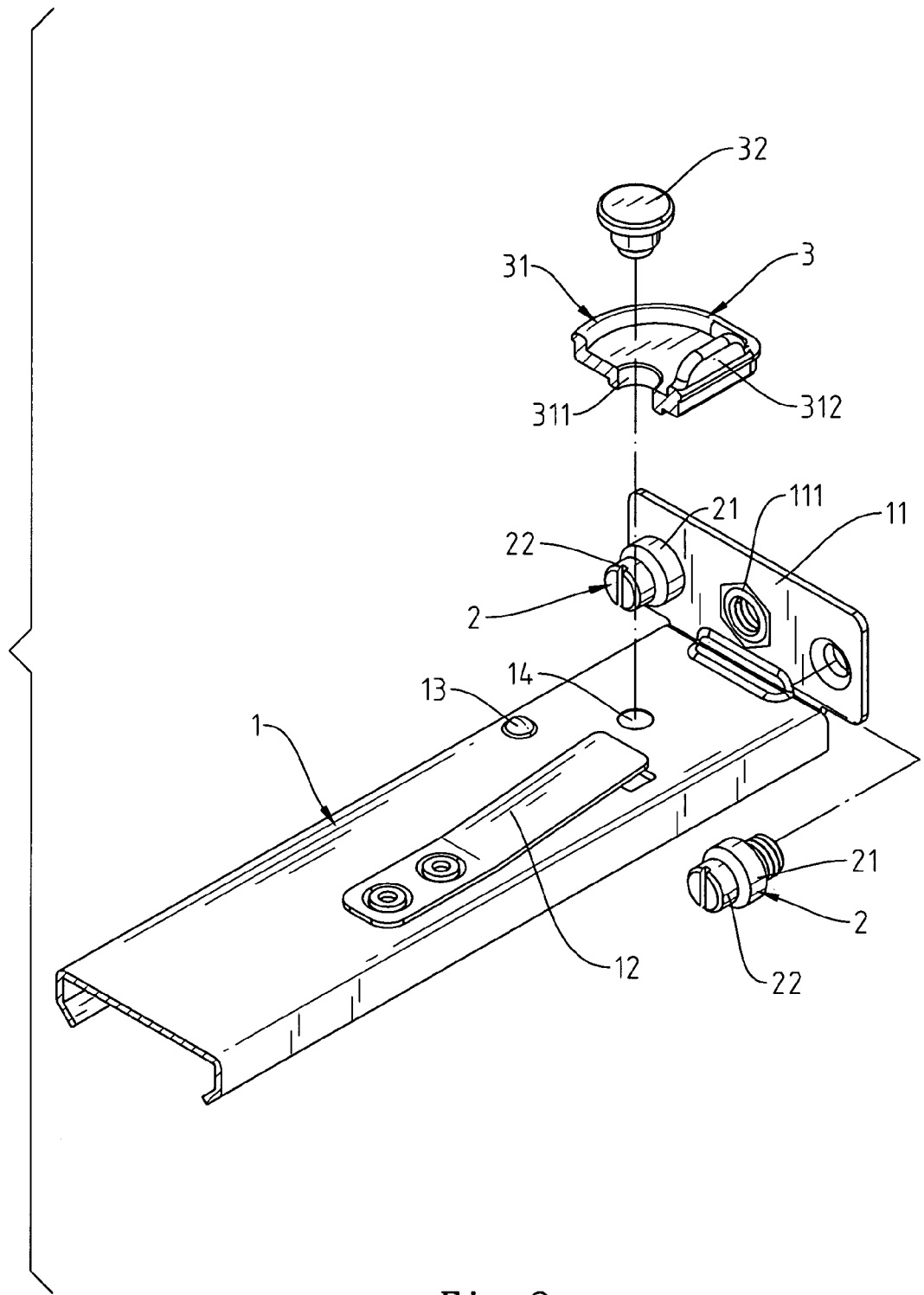
FIG. 2 is an exploded view showing the structure of the present invention.
Figure 3:
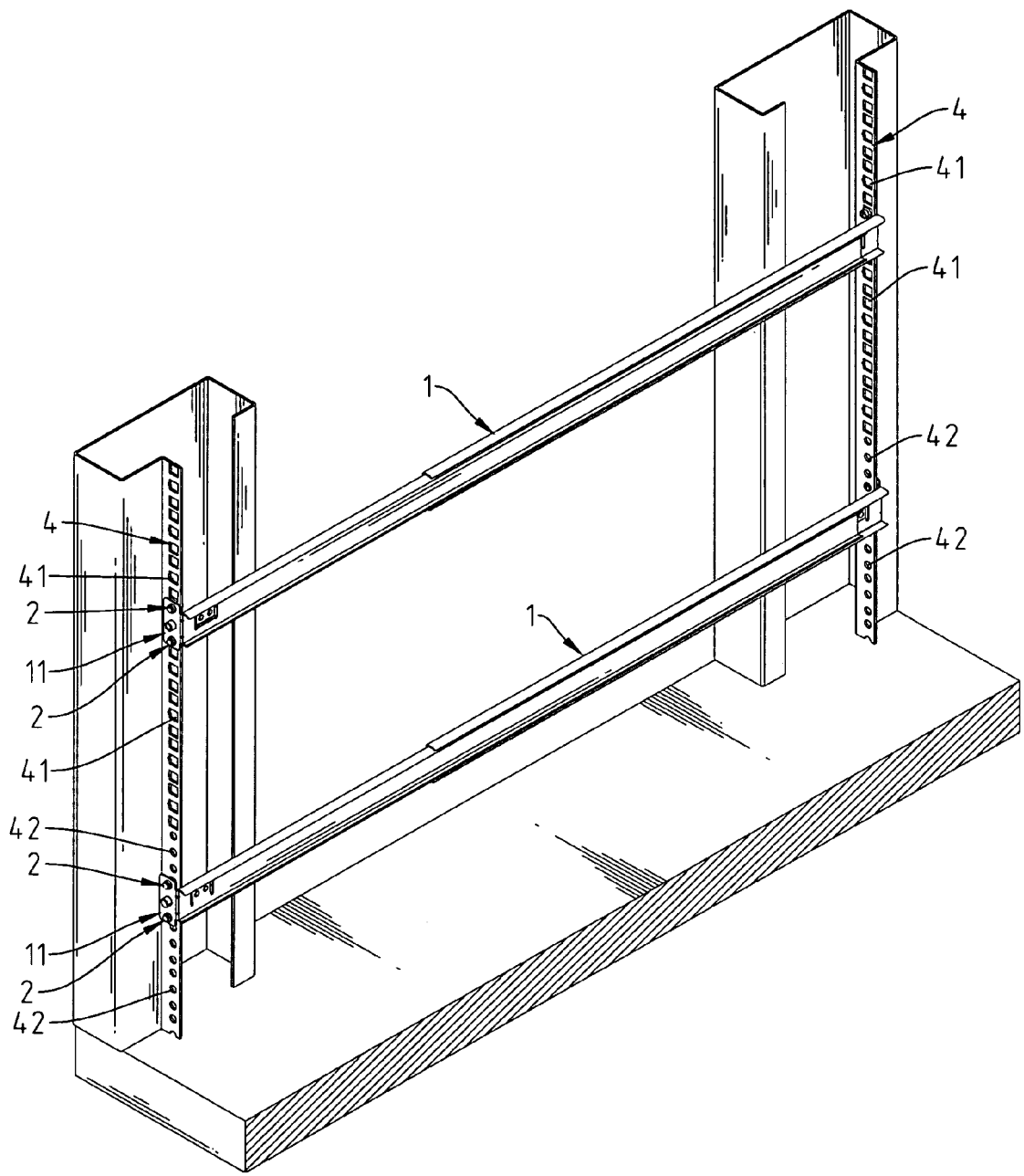
FIG. 3 is a schematic view showing the utilization of the present invention.

Referring to FIG. 1 through FIG. 3, a rotary-type fastening structure of the present invention is a structure for coupling an extension rod 1 with a coupling plate 4. In this preferred embodiment, two kinds of connection holes 41, 42 with different apertures are formed on the coupling plate 4 to adjust the method for locking the rotary-type fastening structure.

A lateral retaining plate 11 is mounted on each side of the extension rod 1, wherein one of these two lateral retaining plates 11 has a locking hole 111 on the center region for further fixing the extension rod 1 to the coupling plate 4. An elastic fastening sheet 12 is riveted on the extension rod 1 inside each of the lateral retaining plates 11, and a through hole 14 is formed on the extension rod 1 between the elastic fastening sheet 12 and the lateral retaining plate 11 for the mounting of two rotatable fastening devices 3. Besides, a retaining part 13 is mounted near the through hole 14.

Each of the rotatable fastening devices 3 is axially positioned on the through hole 14 of the extension rod 1. Each of the rotatable fastening devices 3 has a fan-shaped body 31, wherein the fan-shaped body 31 has an off-center shaft hole 311. A fingerboard 312 is mounted on one lateral edge of the fan-shaped body 31. The rotatable fastening device 3 is axially positioned on the through hole 14 by penetrating a shaft 32 through the off-center shaft hole 311 such that the rotatable fastening device 3 is pivotally rotatable.

Figure 4:
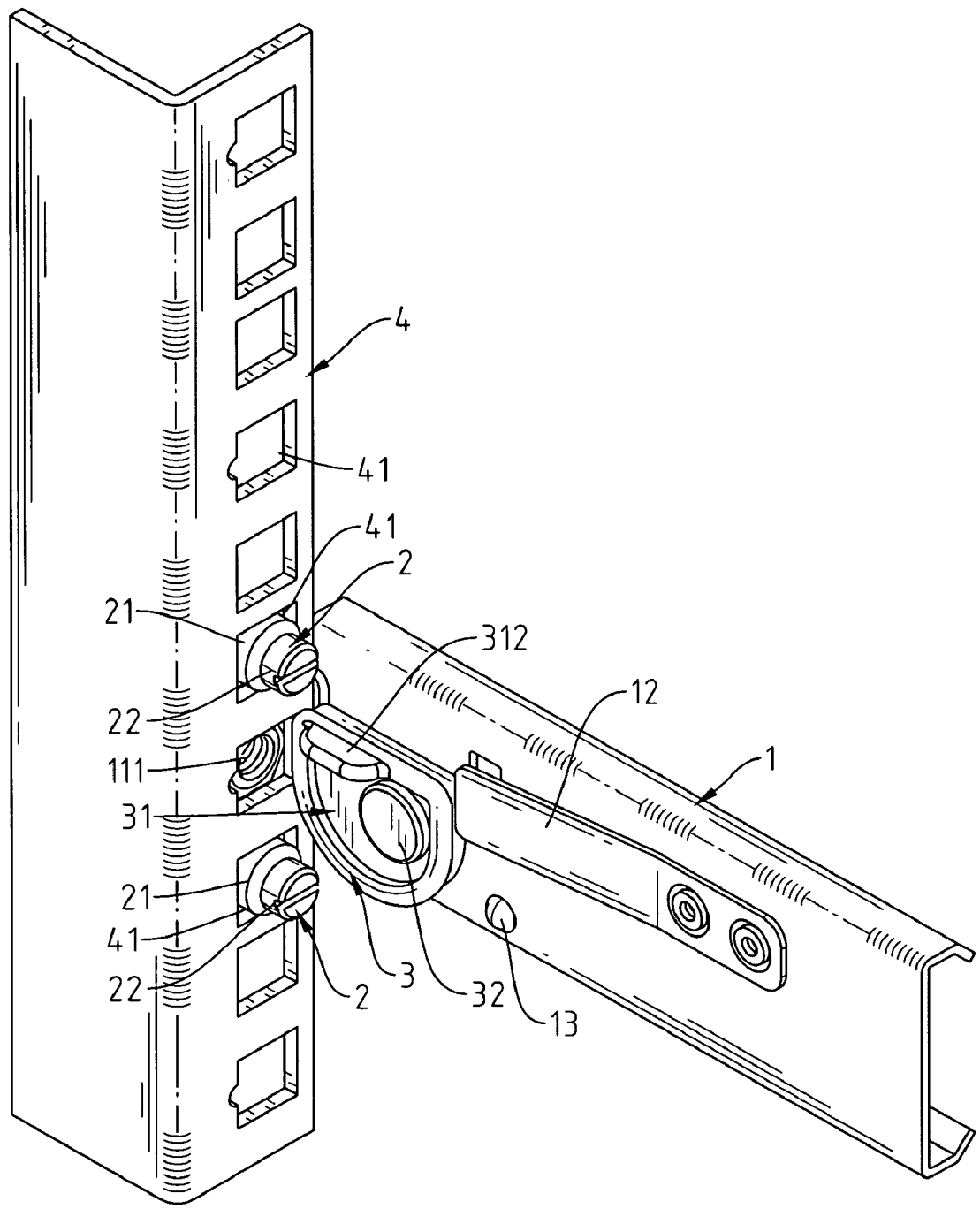
FIG. 4 is an elevational view showing that the rotatable fastening devices are fastened.
Figure 5:
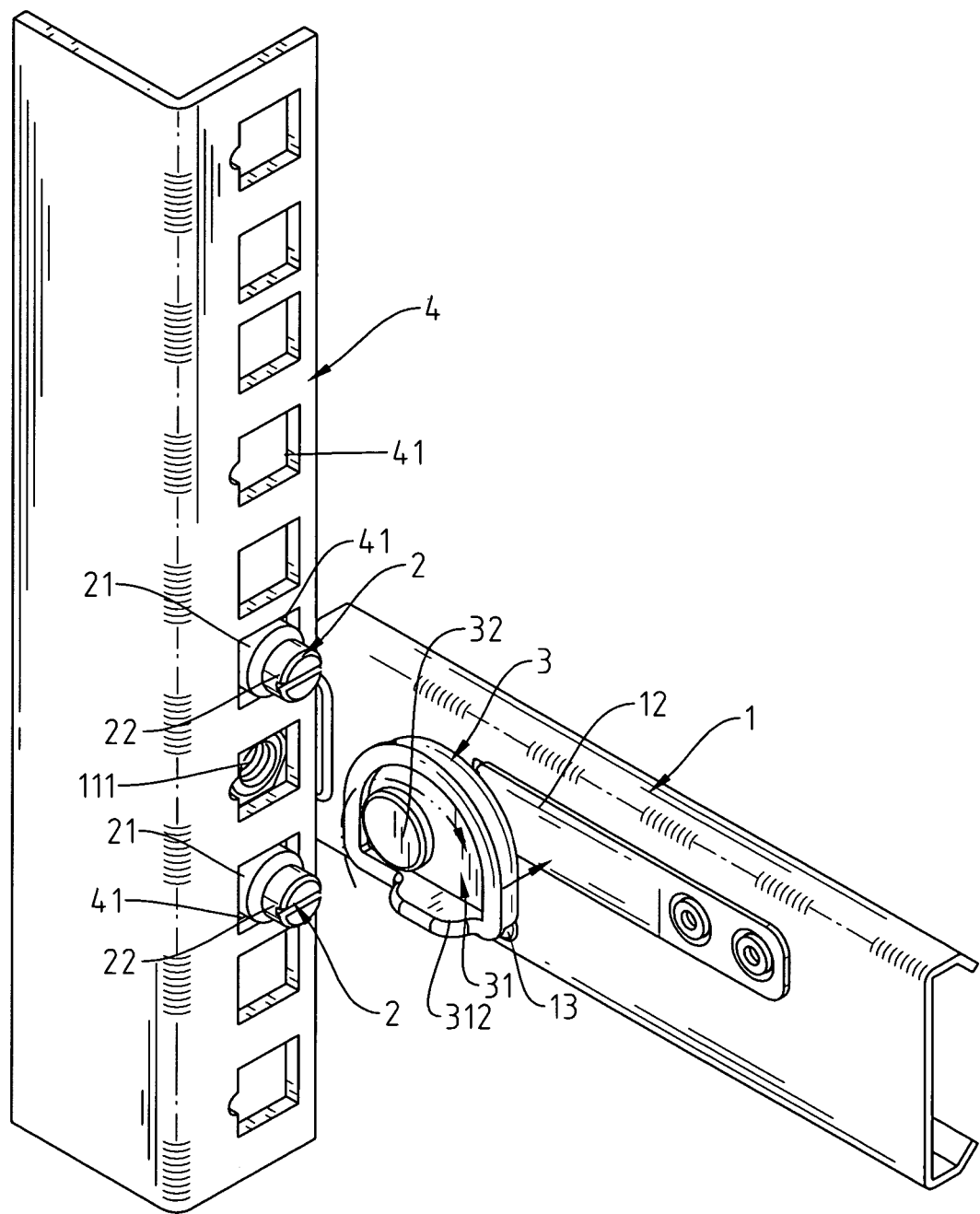
FIG. 5 is a schematic view showing that the rotatable fastening devices of FIG. 4 are released by rotation.

Referring to FIG. 4 and FIG. 5, the extension rod 1 is fixedly coupled with the coupling plate 4. The extension rod 1 is connected to the outside of the coupling plate 4 through the lateral retaining plate 11. The lateral retaining plate 11 is mounted between the extension rod 1 and the coupling plate 4 by inserting two locking devices 2 into the connection holes 41. In order to fix the extension rod 1 on the coupling plate 4, the screwing locking method is adopted in the conventional structure. However, the improvement of the present invention consists in providing the multi-stage locking device without the use of the screw. In the present invention, the rotatable fastening device 3 is pivotally mounted on the through hole 14 of the lateral retaining plate 11 so that the locking devices 2 can be locked on the coupling plate 4 by use of different rims. In these diagrams, the aperture of the connection holes 41 is larger than the aperture of the connection holes 42. As a result, if the extension rod 1 is coupled with the coupling plate 4 by inserting the locking devices 2 into the connection holes 41, the first rims 21 of the locking devices 2 are utilized. Accordingly, the rotatable fastening devices 3 must be rotated in a larger rotation angle. If the rotatable fastening devices 3 are rotated, the fan-shaped bodies 31 of the rotatable fastening devices 3 are located to lean against the coupling plate 4 by use of the farther end so as to fixedly couple the extension rod 1 with the coupling plate 4. If it is desired to separate the extension rod 1 from the coupling plate 4, there is merely a need to pull the fingerboards 312 and to rotate the rotatable fastening devices 3 for positioning them by the retaining parts 13. Thereafter, the rotatable fastening devices 3 are located to further lean on the elastic fastening sheet 12 so as to fix the rotatable fastening devices 3.

Figure 6:
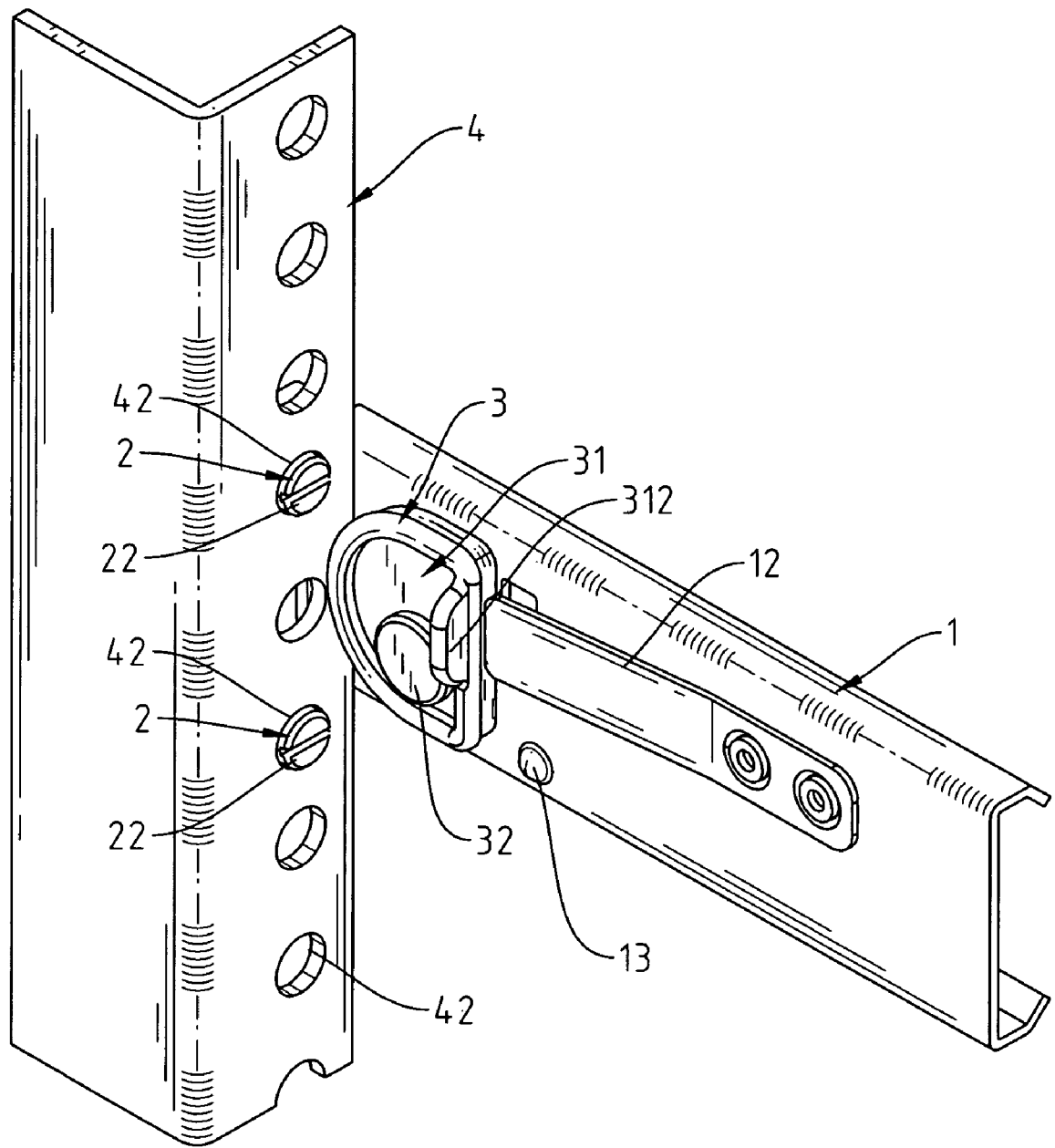
FIG. 6 is an elevational view showing another utilization of the present invention.
Figure 7:
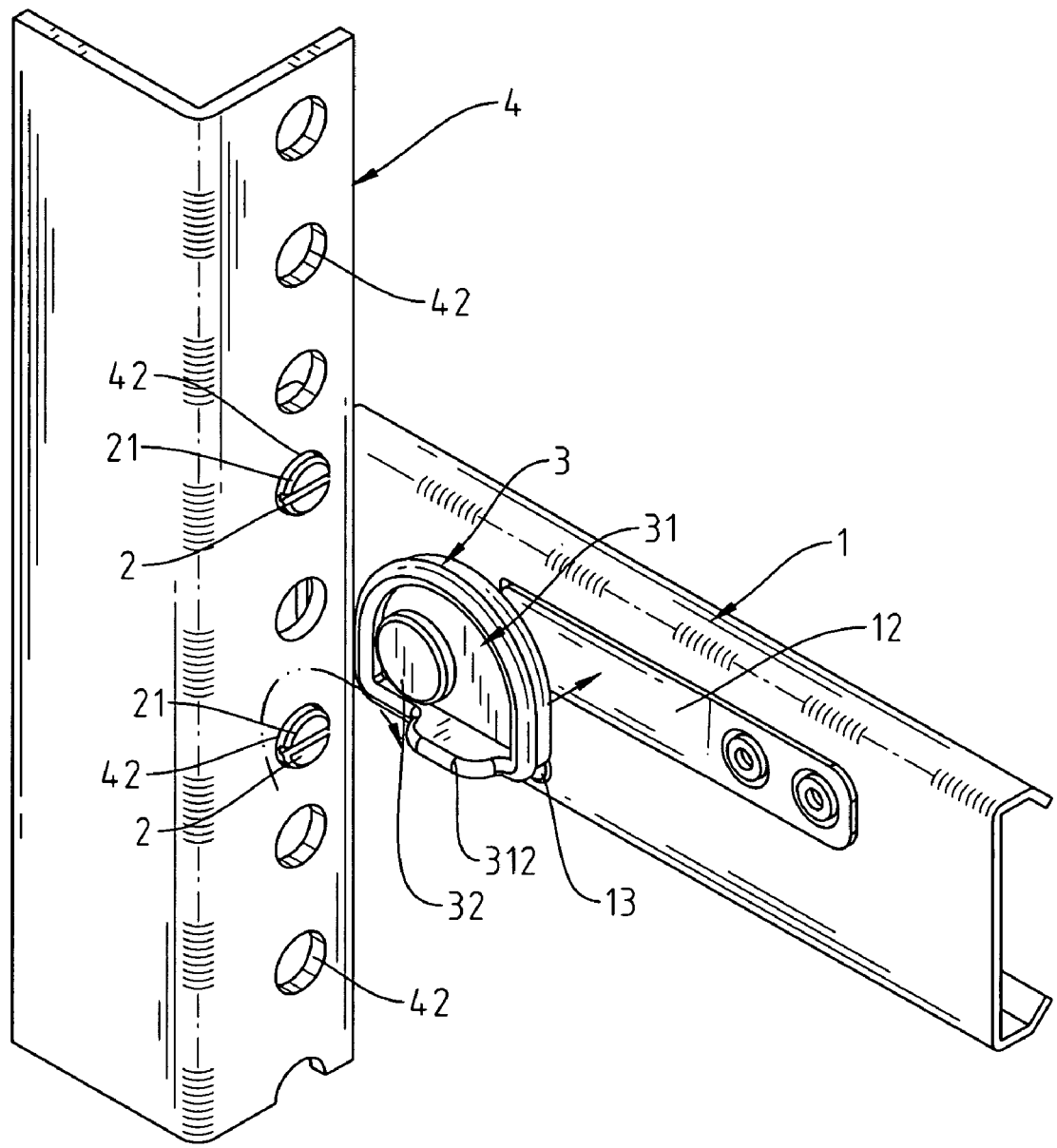
FIG. 7 is a schematic view showing that the rotatable fastening devices of FIG. 6 are released by rotation.

Referring further to FIG. 3, FIG. 6, and FIG. 7, if the locking devices 2 are inserted into the connection holes 42, which have smaller aperture, the second rims 22 of the locking devices 2 are utilized. As a result, the rotatable fastening devices 3 must be rotated in a smaller rotation angle since the insertion depth of the locking devices 2 into the connection holes 42 is smaller than the insertion depth of the locking devices 2 into the connection holes 41.

If there is a need to rotate the rotatable fastening devices 3 for tightly coupling the extension rod 1 with the coupling plate 4, the rotatable fastening devices 3 are rotated off-center so as to fixedly mount the extension rod 1. Besides, the extension rod 1 can be demounted easily by rotating the rotatable fastening devices 3.

The invention claimed is:

1. A rotary-type fastening structure for fixedly coupling an extension rod with a coupling plate, comprising:
   a rotatable fastening device, comprising a main body having an off-center shaft hole, the rotatable fastening device having a straight edge and a curved edge;
   the extension rod comprising: a lateral retaining plate mounted on each side of the extension rod; a locking device mounted on the lateral retaining plate; an elastic fastening sheet riveted on the extension rod inside each of the lateral retaining plates; a through hole formed between the elastic fastening sheet and each of the lateral retaining plates for mounting of the rotatable fastening device; and a retaining part mounted near the through hole; and
   a shaft penetrated into the off-center shaft hole of each of the rotatable fastening devices and the through hole for pivotally positioning the rotatable fastening device on the through hole, wherein the rotatable fastening device is configured to be rotated into a first locking position in which the curved edge abuts the coupling plate for securing the coupling plate between the curved edge and the lateral retaining plate and a second unlocked position in which a gap separates the curved edge from the coupling plate and wherein the elastic fastening sheet restricts rotation of the rotatable fastening device while the rotatable fastening device is in the first locking position.

2. The rotary-type fastening structure of claim 1, wherein the main body is a fan-shaped body, and the rotatable fastening device is rotated off-center so as to lean a lateral portion of the curved edge on the coupling plate.

3. The rotary-type fastening structure of claim 1, wherein a fingerboard is mounted on one lateral edge of the main body of the rotatable fastening device.

4. The rotary-type fastening structure of claim 2, wherein the shaft penetrates the fan-shaped body at a point located at an intersection of the straight edge and the curved edge.

5. The rotary-type fastening structure of claim 1, wherein the elastic fastening sheet is located to have an end of the elastic fastening sheet selectively contact the straight edge of the main body.

* * * * *